United States Patent [19]
Chou et al.

[11] Patent Number: 5,308,780
[45] Date of Patent: May 3, 1994

[54] SURFACE COUNTER-DOPED N-LDD FOR HIGH HOT CARRIER RELIABILITY

[75] Inventors: Jih W. Chou; Joe Ko; Chun Y. Chang, all of Hsinchu, Taiwan

[73] Assignee: United Microelectronics Corporation, Hsinchu, Taiwan

[21] Appl. No.: 94,990

[22] Filed: Jul. 22, 1993

[51] Int. Cl.$^5$ .......................................... H01L 21/265
[52] U.S. Cl. .......................................... 437/44; 437/35
[58] Field of Search ................ 437/44, 35, 27, 30, 437/29

[56] References Cited

U.S. PATENT DOCUMENTS

| | | | |
|---|---|---|---|
| 4,746,624 | 5/1988 | Cham et al. | 437/44 |
| 4,771,012 | 9/1988 | Yabu et al. | 437/29 |
| 4,975,385 | 12/1990 | Beinglass et al. | 437/29 |
| 5,073,514 | 12/1991 | Ito et al. | 437/44 |
| 5,147,811 | 9/1992 | Sakagami | 437/35 |
| 5,158,901 | 10/1992 | Kosa et al. | 437/40 |
| 5,171,700 | 12/1992 | Zamanian | 437/44 |
| 5,217,910 | 6/1993 | Shimizu et al. | 437/35 |

FOREIGN PATENT DOCUMENTS

| | | | |
|---|---|---|---|
| 2-92833 | 12/1990 | Japan | 437/35 |
| 4-79232 | 3/1992 | Japan | 437/27 |
| 4-255233 | 9/1992 | Japan | 437/35 |

OTHER PUBLICATIONS

Wolf and Tauber, "Silicon Processing For The VLSI Era" vol. I, (1986), pp. 292-297.

Wolf and Tauber, "Silicon Processing For The VLSI Era" vol. II, (1990), pp. 348-366.

Primary Examiner—Brian E. Hearn
Assistant Examiner—Lynne A. Gurley
Attorney, Agent, or Firm—George O. Saile

[57] ABSTRACT

A method of forming an integrated circuit field effect transistor with surface counter-doped lightly doped drain regions is described. A gate silicon oxide layer is formed on the silicon substrate. A layer of polysilicon is deposited over the gate silicon oxide layer and etched to form a gate electrode structure. A first ion implantation is performed at a tilt angle to form lightly doped drain regions in the semiconductor substrate wherein the lightly doped drain regions are partially overlapped by the gate electrode structure. A second ion implantation is performed at a larger tilt angle and lower energy than the first ion implantation wherein the second ion implantation counter-dopes the surface of the lightly doped drain regions to form a very lightly doped drain layer thus making the lightly doped drain regions buried regions. A thin layer of silicon oxide is deposited over the surface of the polysilicon gate electrode structure and is anisotropically etched to form ultra thin spacers on the sidewalls of the polysilicon gate electrode structure. A third ion implantation is performed with no tilt angle to complete formation of the lightly doped drain regions. A glasseous layer is deposited over all surfaces of the substrate and flowed followed by metallization and passivation to complete manufacture of the integrated circuit.

19 Claims, 5 Drawing Sheets

SURFACE COUNTER-DOPED N-LDD FOR HIGH HOT CARRIER RELIABILITY

BACKGROUND OF THE INVENTION (1) Field of the Invention

The invention relates to the fabrication of integrated circuit devices, and more particularly, to a method of forming surface counter-doped lightly doped drain regions in the fabrication of integrated circuits.

(2) Description of the Prior Art

Hot carrier effects resulting from high electric fields cause the most severe reliability problems in ULSI (ultra large scale integrated circuit) MOSFET devices. A lightly doped drain (LDD) structure can effectively reduce the electric field, but this advantage is often accompanied by spacer-induced degradation. High driving current or transconductance degradation due to hot carrier damages are observed after electric stress.

Large tilt-angle implanted drain (LATID) processes have been used by a number of workers in the art to form lightly doped drains. Ito et al U.S. Pat. No. 5,073,514 discloses the formation of an LDD MOSFET using LATID to form the N− and then used vertical ion implantation to form the N+ region. Sakagami U.S. Pat. No. 5,147,811 describes the formation of a P region under the gate using LATID and then a vertical ion implant to form the N+ source/drain regions. Kosa et al U.S. Pat. No. 5,158,901 and Yuba et al U.S. Pat. No. 4,771,012 describe other methods of LATID.

SUMMARY OF THE INVENTION

A principal object of the present invention is to provide an effective and very manufacturable method of forming a lightly doped drain.

Another object of the present invention is to provide a method of forming a lightly doped drain which improves hot carrier reliability.

In accordance with the objects of this invention the method of forming an integrated circuit field effect transistor with surface counter-doped lightly doped drain regions is achieved. A gate silicon oxide layer is formed on the silicon substrate. A layer of polysilicon is deposited over the gate silicon oxide layer and etched to form a gate electrode structure. A first ion implantation is performed at a tilt angle to form lightly doped drain regions in the semiconductor substrate wherein the lightly doped drain regions are partially overlapped by the gate electrode structure. A second ion implantation is performed at a larger tilt angle and lower energy than the first ion implantation wherein the second ion implantation counter-dopes the surface of the lightly doped drain regions to form a very lightly doped drain layer thus making the lightly doped drain regions buried regions. A thin layer of silicon oxide is deposited over the surface of the polysilicon gate electrode structure and is anisotropically etched to form ultra thin spacers on the sidewalls of the polysilicon gate electrode structure. A third ion implantation is performed with no tilt angle to complete formation of the lightly doped drain regions. A glasseous layer is deposited over all surfaces of the substrate and flowed followed by metallization and passivation to complete manufacture of the integrated circuit.

BRIEF DESCRIPTION OF THE DRAWINGS

In the accompanying drawings forming a material part of this description, there is shown.

DESCRIPTION OF THE PREFERRED EMBODIMENTS

FIGS. 1 through 6 illustrate an N channel MOSFET integrated circuit device. However, it is well understood by those skilled in the art that a P channel FET integrated circuit device could be formed by simply substituting opposite polarities to those given for the N channel embodiment. Also, in a similar way, a CMOSFET could be formed by making both N channel and P channel devices upon the same substrate.

Figure 1:
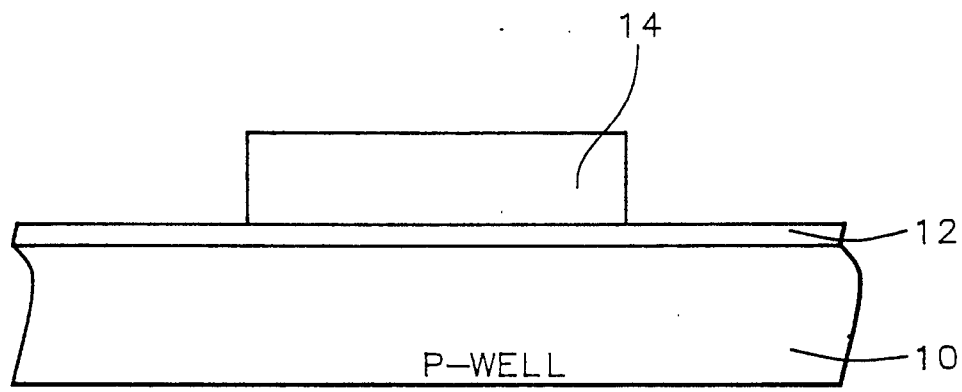
FIGS. 1 through 6 schematically illustrate in cross-sectional representation one preferred embodiment of this invention.

Referring now more particularly to FIG. 1, there is shown an illustration of a portion of a partially completed integrated circuit in which there is a monocrystalline semiconductor substrate 10. The surface of the silicon substrate 10 is thermally oxidized to form the desired gate oxide thickness 12. This layer is between about 30 to 200 Angstroms in thickness.

The polysilicon layer 14 is deposited by low pressure chemical vapor deposition (LPCVD) and doped by phosphorus ion implant. This layer has a preferred thickness of between about 1000 to 4000 Angstroms. The polysilicon layer 14 is etched to form gate electrode structure. Gate lengths are from between about 0.1 to 5 micrometers.

Figure 2:
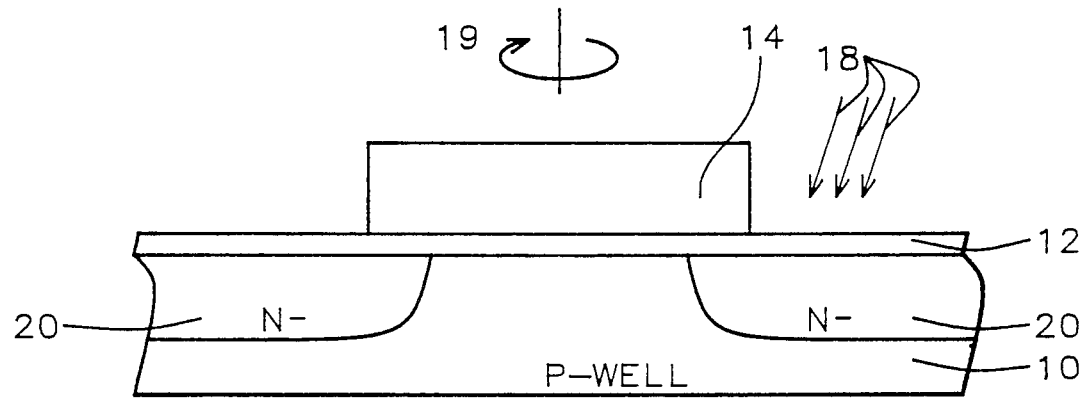

FIG. 2 illustrates the LATID process of implanting phosphorus ions 18 at an energy of between about 30 to 60 Kev and a dosage of between about 1 E 13 to 4 E 13 atoms/cm$^2$ with a tilt angle of between about 30° to 45°. This forms the N− lightly doped drain (LDD) regions 20. 19 illustrates the rotation of the wafer during ion implantation. The wafer rotates at 0.2 to 2 rotations per second for 5 to 10 seconds so as to achieve a symmetrical N− LDD structure.

Figure 3:
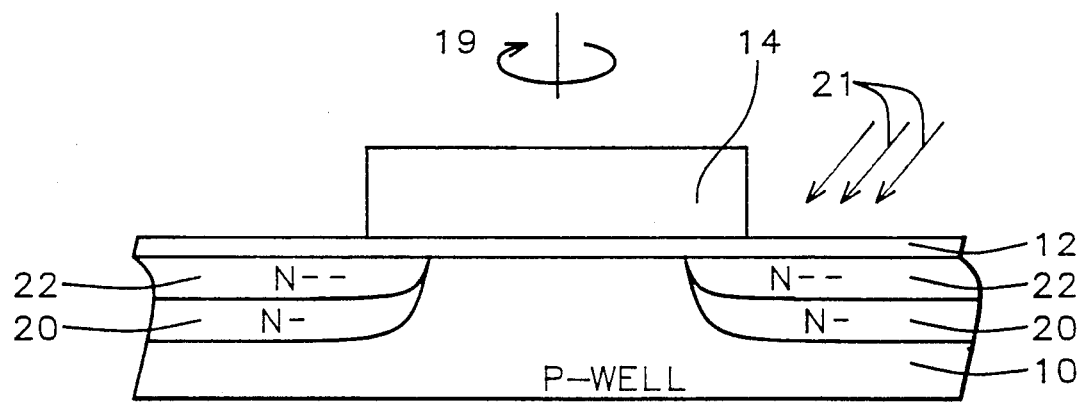
Figure 4:
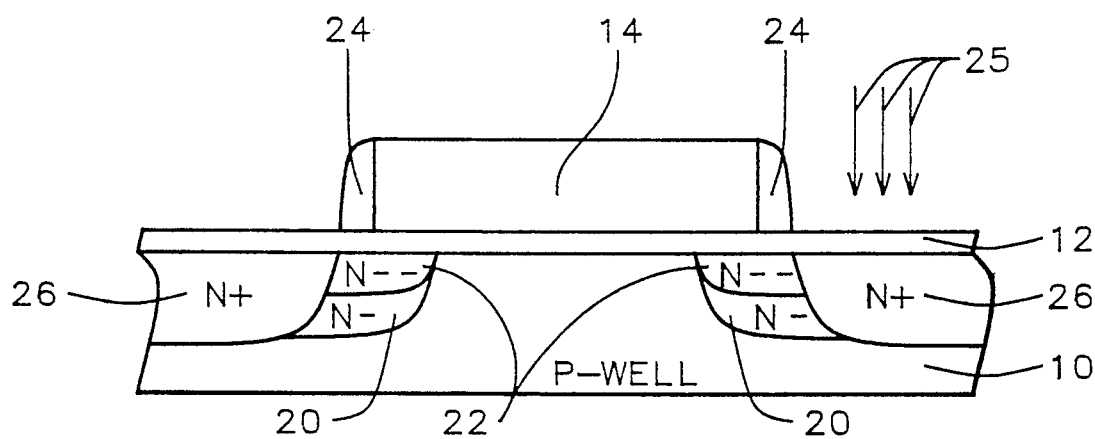

Referring to FIG. 3, an additional BF$_2$ is implanted 21 at the same or lower dosage than that used for the LATID implant, but with a lower energy of between about 20 to 40 Kev and a larger tilt angle of between about 30° to 60°. This counter-dopes the surfaces of the N− regions 20 to form an even lighter layer 22, thus making the N−regions 20 buried N− LDD regions. The wafer is rotated 19 during this implantation in the same way it was rotated during the first implantation.

In order to implement a fully overlapped gate and drain structure, a thin layer of silicon oxide is deposited by chemical vapor deposition to a thickness of between about 1000 to 2500 Angstroms. This layer is etched with a rapid reactive ion etch to form ultra thin sidewall spacers 24, seen in FIG. 4. These spacers are between about 500 to 2000 Angstroms in width. Then, arsenic ions are implanted 25 at a dosage of between about 1 E 15 to 1 E 16 atoms/cm$^2$ at energy levels of 30 to 100 Kev at a 0° or a 7° tilt angle to form N+ regions 26.

Figure 5:
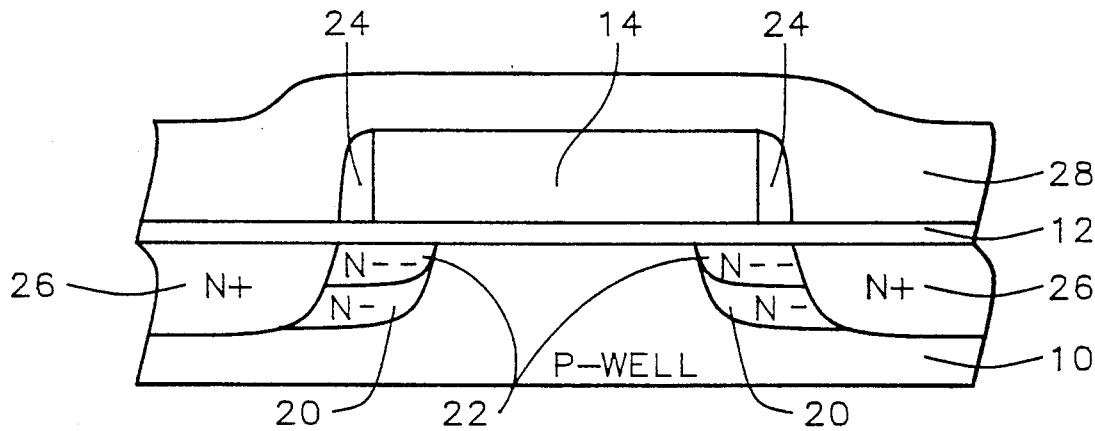

Referring now to FIG. 5, an insulating layer, such as borophosphosilicate glass (BPSG) 28 is deposited over all surfaces of the wafer and reflowed at 800° to 1000° C. for 30 seconds to 90 minutes. The following thermal cycles are limited to restrict lateral diffusion so that the final source/drain junction depth is between about 0.1 to 0.35 micrometers.

Figure 6:
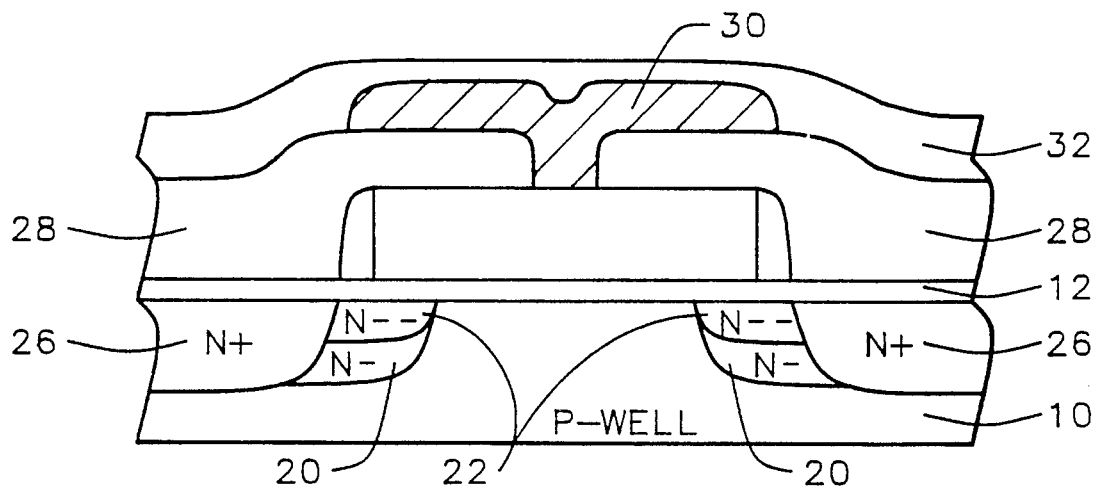

Referring now to FIG. 6, processing continues to make contact openings through the insulating layer 28 to the gate electrode 14. Metallization 30 and passivation layer 32 complete the fabrication of the integrated circuit.

In this invention, by using large tilt angle implant technique, the novel structure surface counter-doped buried lightly doped drain is introduced, using a larger tilt angle and lower energy $BF_2$ implant to counter-dope the surface N− region. The purpose of this $BF_2$ surface implant is to lower the surface concentration of the N− LDD region to form a buried N−− drain. It suppresses the lateral maximum electric field deeper into the silicon substrate and separates the drain current path away from the maximum electric field region.

Figure 7A:
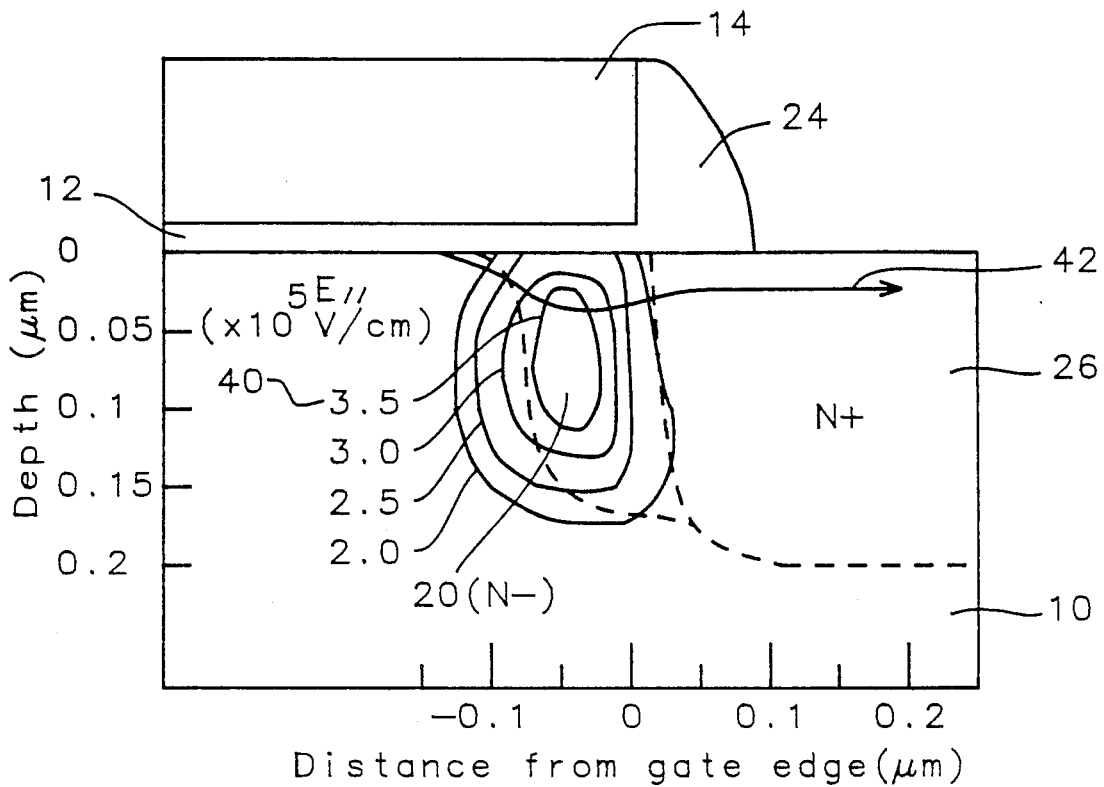
FIG. 7A schematically represents in cross-sectional representation a lightly doped drain of the prior art.
Figure 7B:
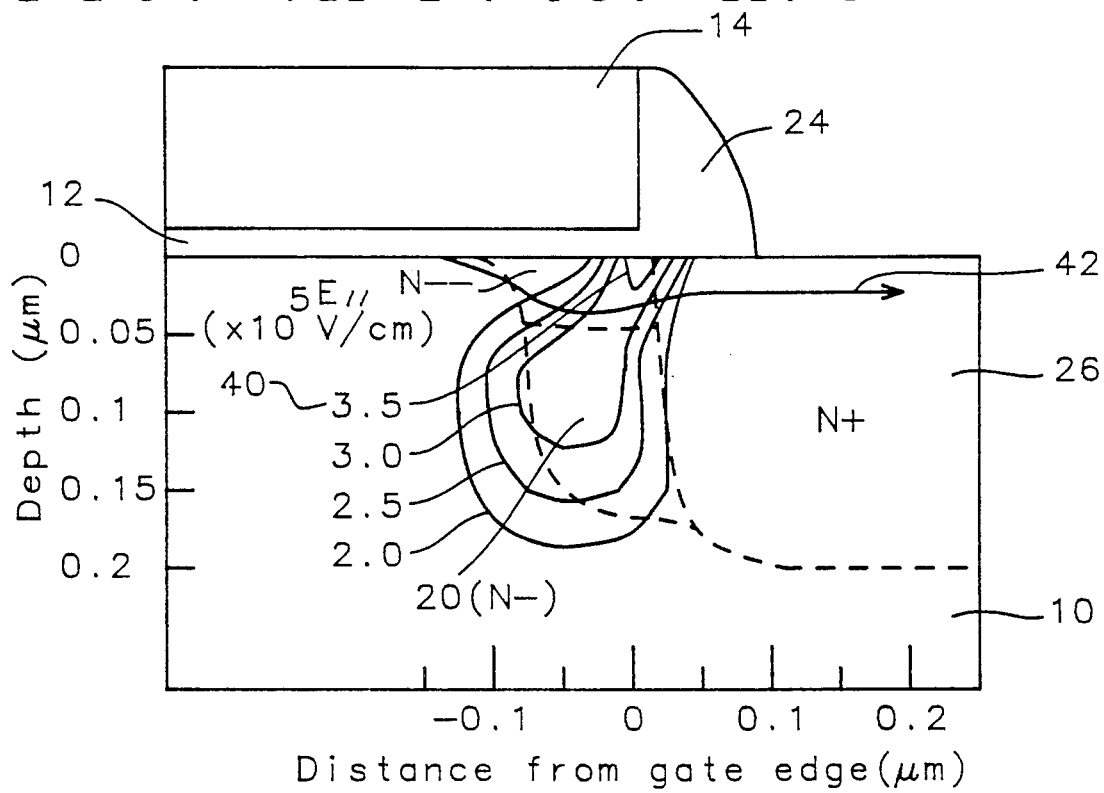
FIG. 7B schematically represents in cross-sectional representation a lightly doped drain of the present invention.

FIGS. 7A and 7B illustrate the simulated contours of lateral electric field E$_{//}$, and paths of saturation current, I$_{dsat}$, for a LATID process and the surface counter-doped (SCD) LDD structure of the present invention, respectively, under bias of V$_{ds}$=5 volts and V$_{gs}$=2 volts. Both figures show a polysilicon gate 14, gate oxide 12, N+ LDD region 26, and N− LDD region 20. As shown in these figures, the minimum E$_{//}$ contour is 2×10$^5$ volts/cm, with an increment of 0.5×10$^5$ volts/cm up to 3.5×10$^5$ volts/cm. Note that in FIG. 7B for a SCD-LDD structure, the lateral electric fields E$_{//}$ near the corner of the gate edge are reduced and suppressed deeper into the substrate, forming a pocket-like contour. The maximum E$_{//}$ for this structure, 40, locates at the channel surface close to the edge of the gate, resulting from steeper concentration change at the N−− layer/N+ drain, 22/26. In contrast, for the LATID structure of the prior art, the maximum E$_{//}$ 40 locates under the oxide spacer 12 as shown in FIG. 7A.

Even though the maximum E$_{//}$ 40 of the SCD-LDD structure (FIG. 7B) occurs near the channel surface, it is small in dimension (30 nanometers) and next to the N+ drain. Accordingly, the thin oxide spacer 24 would not be degraded with such a fully overlapped N LDD/gate structure. In addition, with the SCD-LDD structure, the current is conducted downward as a result of a higher resistance of surface N− layer. Because the current path of I$_{dsat}$ 42 is separated from the maximum E$_{//}$ 40 near the channel surface, the SCD-LDD configuration reduces hot carrier generation from impact ionization along the current path and lowers hot carrier injection from deeper regions.

Figure 8:
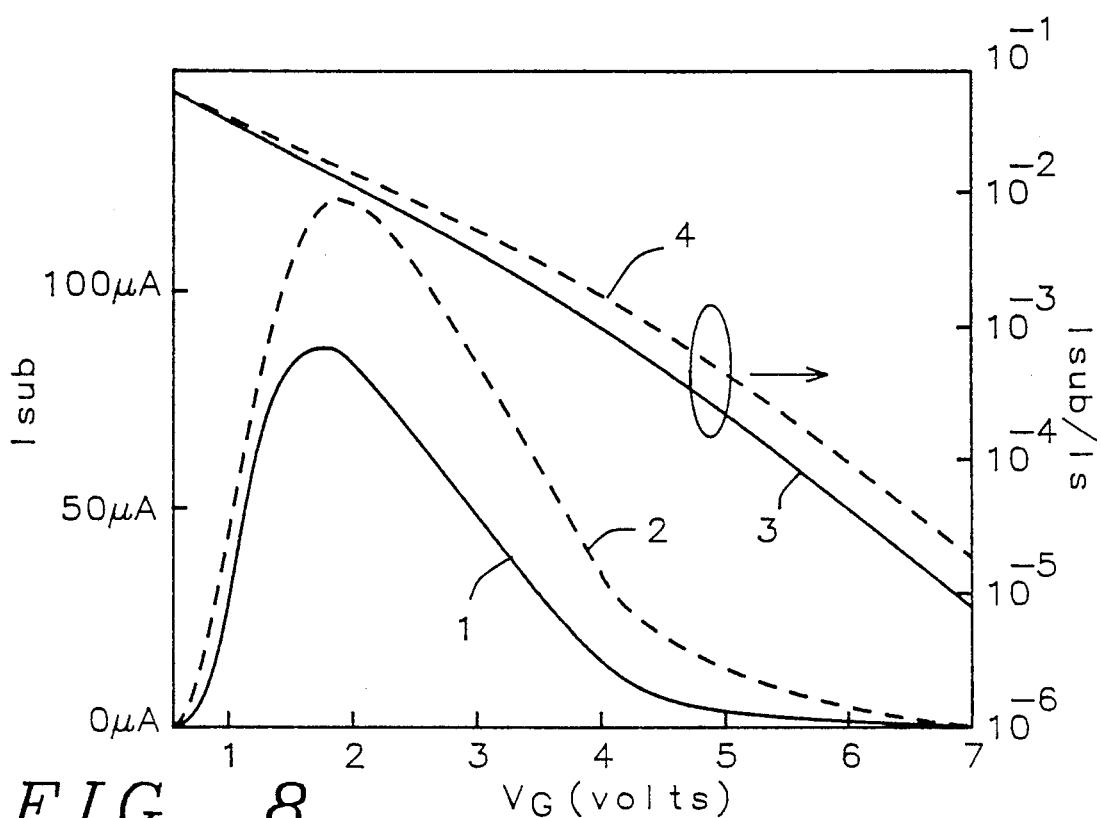
FIG. 8 graphically represents the substrate current voltage characteristics of lightly doped drains of the prior art and of the present invention.

Referring to FIG. 8, there is shown the measured substrate current and its ratio to source current for both the controlled LATID process and the surface counter-doped LDD process of the present invention. The substrate current is caused by impact ionization in the high electric field near the drain; therefore, it is an indicator of impact ionization of a device. Line 1 shows the substrate current of the SCD-LDD process of the invention and Line 2 shows the substrate current of the LATID process. The graph shows that the SCD-LDD process has a reduced impact ionization compared to the LATID process. The ratio of the substrate current to source current is an indicator of electric field. Line 3 shows the ratio for the SCD-LDD process of the invention and Line 4 shows the ratio for the LATID process. The steeper slope of the SCD-LDD process (line 3) implies that there is a smaller effective maximum electric field for the SCD-LDD process than there is for the LATID process.

The ratio of the substrate current to the source/drain saturation current decreases significantly as the result of reduced impact ionization. The saturation current is slightly reduced by this process, but this decrease can be resolved by increasing the dosage and/or the energy of the N−implant. Consequently, the interface damages and oxide trapped charges from hot carrier injection are suppressed. By using the surface counter-doped lightly doped drain structure of the present invention, the reliability is improved by 3 to 5 times over that of the controlled LATID process.

The following Examples are given to show the important features of the invention and to aid in the understanding thereof and variations may be made by one skilled in the art without departing from the spirit and scope of the invention.

EXAMPLES

The TSUPREM-IV by Technology Modeling Associates, Inc. was adopted to simulate the two-dimensional doping profiles of implanted species under the gate edge. An increase of 0.05 to 0.08 micrometers effective channel length of the surface counter-doped lightly doped drain (SCD-LDD) over the controlled LATID process were observed which are presumably due to the $BF_2$ implant above the N− LDD surface. Threshold voltages of SCD-LDD's are 20 to 40 millivolts higher than LATID's. This is due to the longer effective channel length and the lower surface concentration on the N−− layer under the corner of the gate electrode. The punchthrough voltages of width 50 micrometers and effective length 0.35 micrometers of the SCD-LDD's and LATID's are 10.9 and 10.6 volts, respectively. Therefore, there were found no significant influences of the additional $BF_2$ implantation on punchthrough voltages. Table I compares current voltage characteristics of SCD-LDD's and LATID's with width 50 micrometers and effective length 0.35 micrometers, as obtained from simulation by TSUPREM-IV.

TABLE I

| $BF_2$ Implant Energy | 20 Kev | 30 Kev | 40 Kev | LATID |
|---|---|---|---|---|
| I$_{dsat}$ (mA) | 24.56 | 24.23 | 22.99 | 24.89 |
| Gm (mA/V) | 1.2E-03 | 1.07E-03 | 1.03E-03 | 1.14E-03 |
| I$_{sub}$ (uA) | 102.3 | 90.07 | 79.2 | 113.2 |
| I$_{sub}$/I$_{dsat}$ (uA/mA) | 4.165 | 3.717 | 3.445 | 4.548 |

The dosage of the $BF_2$ implant is the same in each case −3 E 13 ions/cm$^2$ and the tilt angle is 60°. The controlled LATID phosphorus implant has the same dosage 3 E 13 ions/cm$^2$ and the tilt angle is 30°. Compared with the controlled LATID, the source/drain saturation currents I$_{dsat}$ (at 5 volts) of the SCD-LDD decrease 1.3%, 2.7%, and 7.6% as the $BF_2$ implant energies are 20, 30, and 40 Kev, respectively. The large tilt angle $BF_2$ implant at the surface of the N− LDD lowers surface concentration of N− LDD and increases resistance slightly. The higher energy $BF_2$ implant increases resistance on the upper layer of the N—drain region; therefore, $I_{dsat}$ decreases with increasing BF$_2$ implant energy beyond 40 Kev.

The reductions of maximum transconductance, Gm, are accounted for by the same reasons as the decreasing $I_{dsat}$. Although the $I_{dsat}$ of the SCD-LDD's decreased slightly due to the additional resistances above the N— region, the ratios of $I_{sub}/I_{dsat}$ were reduced significantly as the BF$_2$ implant energies increased. The decrease of $I_{sub}/I_{dsat}$ is attributed to the reduced impact ionization near the drain field with the additional BF$_2$ implant. The decrease of $I_{dsat}$ can be resolved by increasing the dosage and/or energy of the N— implant.

The peak concentrations of BF$_2$ are 1.5 E 18, 1 E 18, and 7 E 17 atoms/cm$^3$ with implant energies of 40, 30, and 20 Kev, respectively, at a tilt angle of 60° while that of phosphorus is 2 E 18 atoms/cm$^3$. This indicates the net concentrations in the range of 40 nanometers from the N— LDD surface under the gate edge are remarkably reduced and graded in the SCD-LDD's. These decreases of N— surface concentrations account for the $I_{dsat}$ reductions as BF$_2$ implant energies increase. A low $I_{sub}$ means less impact ionization and results in less hot carrier damage and better reliability.

Figure 9:
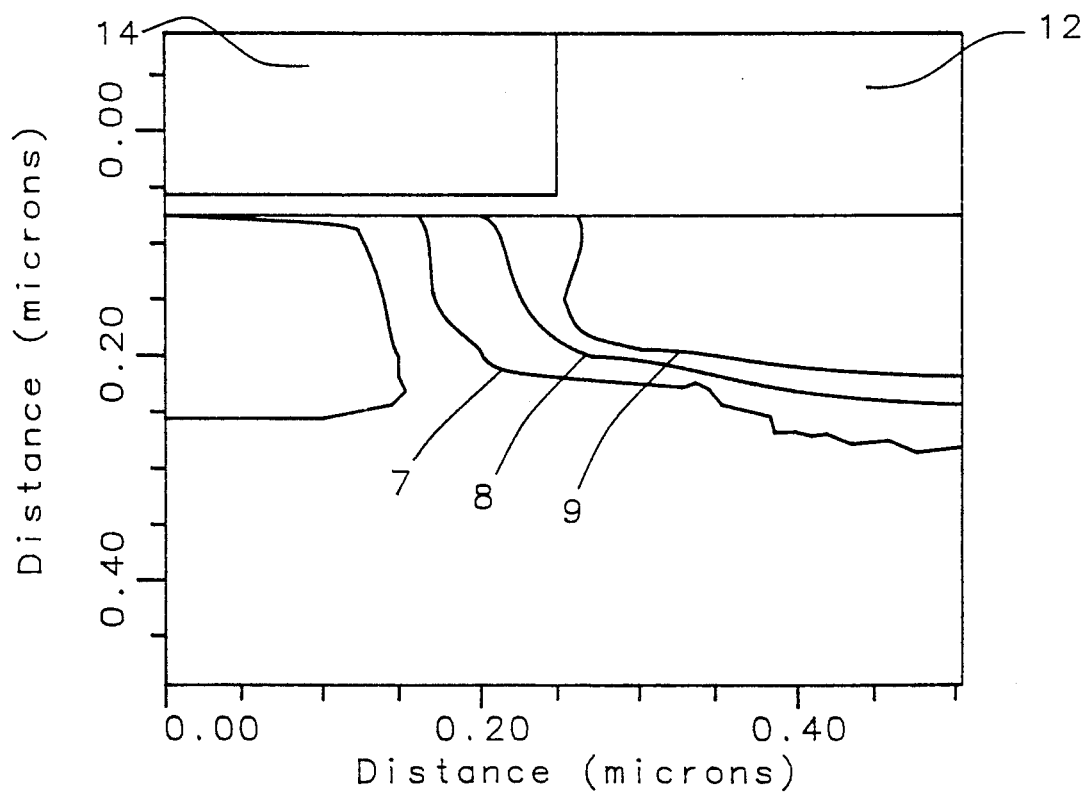
FIG. 9 graphically represents the simulated doping profiles of a lightly doped drain of the prior art.
Figure 10:
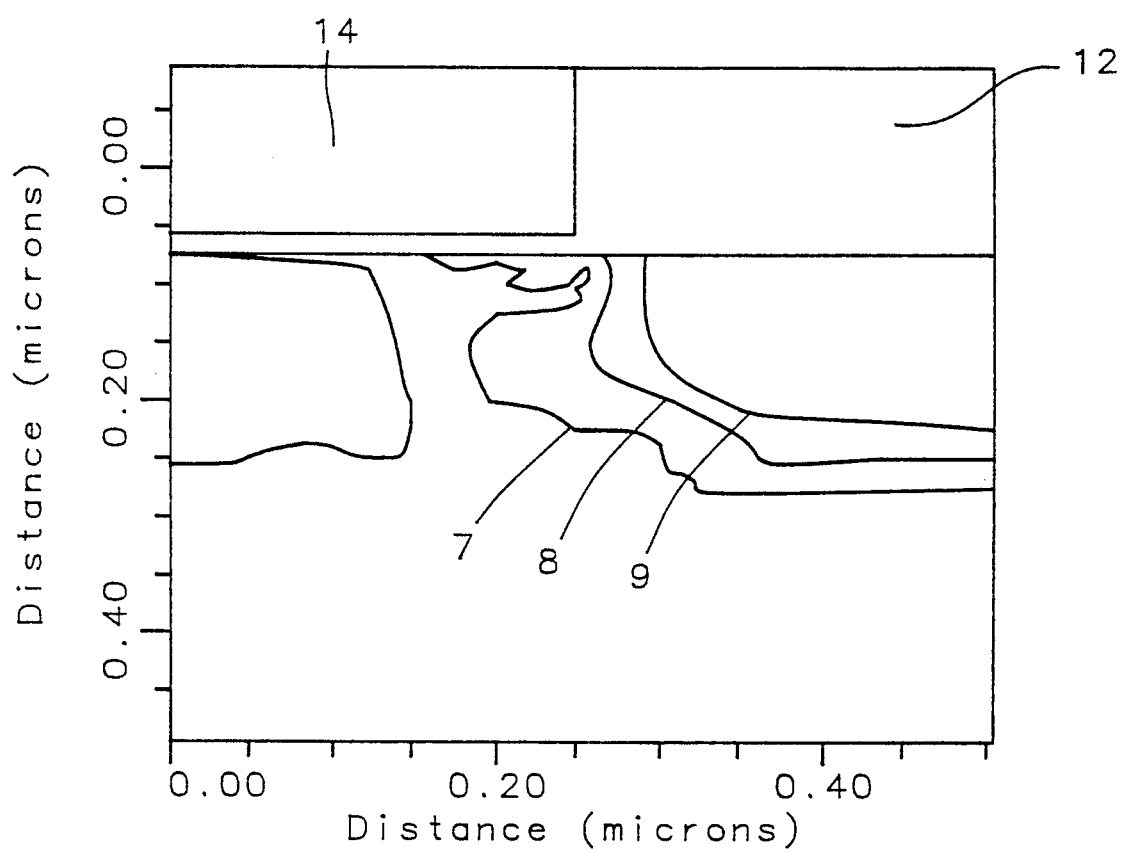
FIG. 10 graphically represents the simulated doping profiles of a lightly doped drain of the present invention.

Referring now to FIGS. 9 and 10, we see the simulated two dimensional doping profiles from the TSU-PREM-IV simulator for a conventional controlled LATID process (FIG. 9) and for the process of the invention (FIG. 10). The doping profiles are shown under the gate 14 and gate oxide 12. Line 7 indicates the contour for a doping concentration of 1 E 17 atoms/cm$^3$; line 8, a doping concentration of 1 E 18 atoms/cm$^3$; and line 9, a doping concentration of 1 E 19 atoms/cm$^3$. In the SCD-LDD (FIG. 10), since the N— region is counter-doped, the net doping concentration is reduced, and therefore, the contour of line 7 is stretched out from 0.2 to 0.25 micrometers. The effective channel length is also increased by 0.05 to 0.08 micrometers because of the lower surface concentration.

Devices with width/length of 50/0.5 micrometers were stressed at the drain avalanche hot carrier injection region; that is, the maximum substrate current $V_D=7$ or 6.5 volts, and $V_G=2.5$ volts. The threshold voltage degradation of the SCD-LDD's was remarkably lower than that of the controlled LATID's which implies that the trapped charges in oxide of the SCD-LDD's were fewer. From the degradation of transconductance, it was found that there was not only lower degradation in the SCD-LDD's, but also a smaller rate of degradation as compared with the controlled LATID's. The lower degradations of current voltage characteristics of the surface counter-doped lightly doped drains of the present invention (SCD-LDD's) were considered to result from the following: 1) the lower maximum lateral electric field region, 2) the lower impact ionization near the drain, and 3) the longer hot carrier injection length along the silicon/silicon oxide interface significantly reduced hot carrier injection probability and, in turn, interface damages.

The preferred LATID process variables were found to be an implant phosphorus dosage of between about 2.5 E 13 to 3.4 E 13 atoms/cm$^2$, depending on the channel length and substrate doping design, at an energy of 50 to 60 Kev and a tilt angle of 30° to 45°. For the SCD-LDD process, the dosage of BF$_2$ should be less than or equal to that of the LATID process. Energy should be 30 to 40 Kev at a tilt angle of 30° to 45°.

While the invention has been particularly shown and described with reference to the preferred embodiments thereof, it will be understood by those skilled in the art that various changes in form and details may be made without departing from the spirit and scope of the invention.

What is claimed is:

1. The method of forming a surface counter-doped lightly doped drain in the manufacture of an integrated circuit comprising:
    forming a gate silicon oxide layer on the surface of a semiconductor substrate;
    depositing a layer of polysilicon over said gate silicon oxide layer;
    etching said polysilicon layer to said gate oxide layer to form a gate electrode structure;
    performing a first ion implantation at a tilt angle to form lightly doped drain regions in said semiconductor substrate wherein said lightly doped drain regions are partially overlapped by said gate electrode structure;
    performing a second ion implantation at a larger tilt angle and lower energy than said first ion implantation wherein said second ion implantation counter dopes the surface of said lightly doped drain regions to form a very lightly doped drain layer thus making said lightly doped drain regions buried regions;
    depositing a thin layer of silicon oxide over the surface of said polysilicon gate electrode structure;
    anisotropically etching said thin layer of silicon oxide to form ultra thin spacers on the sidewalls of said polysilicon gate electrode structure;
    performing a third ion implantation to complete formation of said lightly doped drain; and
    depositing and flowing a glasseous layer over all surfaces of said substrate and completing manufacture of said integrated circuit.

2. The method of claim 1 wherein the thickness of said gate silicon oxide layer is between about 30 to 200 Angstroms.

3. The method of claim 1 wherein the length of said gate electrode structure is between about 0.1 to 5 micrometers.

4. The method of claim 1 wherein said first ion implantation is done with phosphorus ions at a dosage of between about 1 E 13 to 4 E 13 atoms/cm$^2$ and an energy of between about 30 to 60 Kev at a tilt angle of between about 30° to 45°.

5. The method of claim 1 wherein said second ion implantation is done with BF$_2$ ions at most the same dosage as said first ion implantation and an energy of between about 20 to 40 Kev at a tilt angle of between about 30° to 60°.

6. The method of claim 1 wherein said first and second ion implantations are performed while the wafer containing said silicon substrate is rotated at 0.2 to 2.0 rotations per second for 5 to 10 seconds for a symmetrical implantation.

7. The method of claim 1 wherein said thin silicon oxide layer is between about 1000 to 2500 Angstroms in thickness.

8. The method of claim 1 wherein said anisotropic etching of said thin silicon oxide is a reactive ion etch to form ultra thin spacers that are 500 to 2000 Angstroms in thickness.

9. The method of claim 1 wherein said third ion implantation is performed with Arsenic ions at a dosage of between about 1 E 15 to 1 E 16 atoms/cm$^2$ and energy of 30 to 100 Kev at a 0° tilt angle to complete the N+ lightly doped drain formation.

10. The method of claim 1 wherein said third ion implantation is performed with Arsenic ions at a dosage of between about 1 E 15 to 1 E 16 atoms/cm$^2$ and energy of 30 to 100 Kev at a 7° tilt angle to complete the N+ lightly doped drain formation.

11. The method of forming a surface counter-doped lightly doped drain in the manufacture of an integrated circuit comprising:

providing a polysilicon gate electrode on the surface of a semiconductor substrate;

performing a first ion implantation at a tilt angle to form lightly doped drain regions in said semiconductor substrate wherein said lightly doped drain regions are partially overlapped by said gate electrode on a gate silicon oxide layer;

performing a second ion implantation at a larger tilt angle and lower energy than said first ion implantation wherein said second ion implantation counter dopes the surface of said lightly doped drain regions to form a very lightly doped drain layer thus making said lightly doped drain regions buried regions;

depositing a thin layer of silicon oxide over the surface of said polysilicon gate electrode;

anisotropically etching said thin layer of silicon oxide to form ultra thin spacers on the sidewalls of said polysilicon gate electrode; and performing a third ion implantation to complete formation of said lightly doped drain in the manufacture of said integrated circuit.

12. The method of claim 11 wherein the length of said gate electrode is between about 0.1 to 5 micrometers.

13. The method of claim 11 wherein said first ion implantation is done with phosphorus ions at a dosage of between about 1 E 13 to 4 E 13 atoms/cm$^2$ and an energy of between about 30 to 60 Kev at a tilt angle of between about 30° to 45°.

14. The method of claim 11 wherein said second ion implantation is done with BF$_2$ ions at least the same dosage as said first ion implantation and an energy of between about 20 to 40 Kev at a tilt angle of between about 30° to 60°.

15. The method of claim 11 wherein said first and second ion implantations are performed while the wafer containing said silicon substrate is rotated at 0.2 to 2.0 rotations per second for 5 to 10 seconds for a symmetrical implantation.

16. The method of claim 11 wherein said thin silicon oxide layer is between about 1000 to 2500 Angstroms in thickness.

17. The method of claim 11 wherein said anisotropic etching of said thin silicon oxide is a reactive ion etch to form ultra thin spacers that are 500 to 2000 Angstroms in thickness.

18. The method of claim 11 wherein said third ion implantation is performed with Arsenic ions at a dosage of between about 1 E 15 to 1 E 16 atoms/cm$^2$ and energy of 30 to 100 Kev at a 0° tilt angle to complete the N+ lightly doped drain formation.

19. The method of claim 11 wherein said third ion implantation is performed with Arsenic ions at a dosage of between about 1 E 15 to 1 E 16 atoms/cm$^2$ and energy of 30 to 100 Kev at a 7° tilt angle to complete the N+ lightly doped drain formation.

* * * * *